United States Patent
Chen

(10) Patent No.: US 6,171,955 B1
(45) Date of Patent: Jan. 9, 2001

(54) METHOD FOR FORMING HEMISPHERICAL GRAINED SILICON STRUCTURE

(75) Inventor: Shih-Ching Chen, Nantou Hsien (TW)

(73) Assignee: United Semiconductor Corp., Hsinchu (TW)

(*) Notice: Under 35 U.S.C. 154(b), the term of this patent shall be extended for 0 days.

(21) Appl. No.: 09/246,226

(22) Filed: Feb. 8, 1999

(30) Foreign Application Priority Data

Jan. 4, 1999 (TW) .................................. 88100005

(51) Int. Cl.$^7$ .......................... H01L 21/44; H01L 21/20; H01L 21/8242

(52) U.S. Cl. .......................... 438/665; 438/396; 438/398; 438/253; 438/255

(58) Field of Search .................................. 438/665, 398, 438/396, 253, 255

(56) References Cited

U.S. PATENT DOCUMENTS

| | | | |
|---|---|---|---|
| 5,182,232 | * | 1/1993 | Chhabra et al. . |
| 5,266,514 | * | 11/1993 | Tuan et al. . |
| 5,372,962 | * | 12/1994 | Hirota et al. . |
| 5,656,531 | * | 8/1997 | Thakur et al. . |
| 5,691,249 | * | 11/1997 | Watanabe et al. . |
| 5,759,262 | * | 6/1998 | Weimer et al. . |
| 5,837,582 | * | 11/1998 | Su . |
| 5,963,815 | * | 10/1999 | Okamoto et al. . |
| 5,970,360 | * | 10/1999 | Cheng et al. . |
| 5,981,351 | * | 11/1999 | Nam et al. . |
| 6,025,248 | * | 2/2000 | Kim et al. . |
| 6,066,539 | * | 5/2000 | Green et al. . |

* cited by examiner

Primary Examiner—Charles Bowers
Assistant Examiner—Stephen W. Smoot
(74) Attorney, Agent, or Firm—J.C. Patents; Jaiwei Huang

(57) ABSTRACT

A method is described for forming a hemispherical grained silicon structure. A patterned amorphous silicon layer is formed over a wafer. The amorphous silicon layer is etched by an etching step with a mixed solution including a hydrofluoric solution and an oxidizing agent. A cleaning step is performed with the hydrofluoric solution. An annealing step is performed to form the hemispherical grained silicon structure.

15 Claims, 2 Drawing Sheets

METHOD FOR FORMING HEMISPHERICAL GRAINED SILICON STRUCTURE

CROSS-REFERENCE TO RELATED APPLICATION

The application claims the priority benefit of Taiwan application Ser. No. 88100005, filed Jan. 4, 1999.

BACKGROUND OF THE INVENTION

1. Field of the Invention

The present invention relates to a semiconductor fabricating method. More particularly, the present invention relates to a method of forming a hemispherical grained silicon (HSG-Si) structure.

2. Description of the Related Art

Because the integration of integrated circuit increases, it is important for the semiconductor industry to consider new manufacturing techniques that enable fabrication of devices on a sub-micron scale. In a fabrication process of a dynamic random access memory (DRAM), size of a DRAM capacitor needs to be decreased in order to decrease the planar area occupied by the capacitor. However, size reduction decreases the surface area of a bottom electrode of the DRAM capacitor. Hence, the charge-storage capacity of the capacitor is decreased.

One way to increase charge-storage ability of the DRAM capacitor is to use a HSG-Si structure for forming a bottom electrode. An electrode formed with the HSG-Si Structure has a greater surface area, and therefore a greater capacitance for the capacitor is obtained because the HSG-Si structure provides a rough, granular surface.

Current methods for forming the HSG-Si structure include the following steps. A doped amorphous silicon layer is deposited by low-pressure chemical vapor deposition (LPCVD) at 520° C. with $SiH_4$ serving as a gaseous source. The doped amorphous silicon is deposited to serve as a starting material for HSG silicon growth. A seeding process is performed on the starting material at between 550° C. and 560° C. with a low flow rate (<<40 sccm). The starting material is seeded with silicon hydrides, such as silane ($SiH_4$) or disilane ($Si_2H_6$), serving as a gaseous source. The seeded starting material is annealed by a high-vacuumed annealing step to grow the HSG-Si structure at between 550° C. and 590° C.

These conventional method, however, are plagued by several drawbacks, including the following:

1. In the seeding process, a clean surface is an important factor to decide whether or not a wafer is suitable for seeding growth. A contaminated wafer is hard to seed. In order to remove the contaminates from the wafer, an intervening cleaning process with a hydrofluoric acid (HF) must be performed before the seeding process. However, the cleaning process is usually difficult to control. If the cleaning step is not carried out properly, the clean surface provided for seeding growth is decreased. This, in turn, affects the HSG-Si growth. Hence, the surface area of bottom electrode cannot be increased effectively.

2. Another drawback caused by the conventional seeding process is that the step must be carried out in a specific chamber. After performing the seeding process for a period of time, silicon hydrides form on the chamber walls. The thermal conductivity of the chamber is decreased because of the formation of silicon hydrides. The throughput thus is decreased. Therefore, the chamber must be cleaned after a period of time in order to maintain the throughput. However, the chamber-cleaning process often takes six days. This time-consuming cleaning process greatly affects the fabrication process.

3. In the seeding process, only the silicon hydrides are used as seeding materials. A low flow rate (<<40 sccm) is required in order to increase the HSG-Si growth selectivity between the silicon material and the other material. Hence, the seeding process is time-consuming.

SUMMARY OF THE INVENTION

The invention provides a method for forming a hemispherical grained silicon (HSG-Si) structure. An amorphous silicon layer is formed on a substrate. An etching step is performed with an etching solution to etch the amorphous silicon layer. The etching solution comprises a hydrofluoric acid, an oxidizing agent, and $H_2O$. A cleaning step is performed with a hydrofluoric solution. An annealing step is performed to form the HSG-Si structure.

So as to obtain a rough surface for forming the HSG-Si structure, the etching step is performed to etch the surface of the amorphous silicon layer to form the cavities. The cavities amplify the degree of roughness of the amorphous silicon layer. Additionally, the contaminates, such as silicon oxide, formed on the amorphous silicon layer are removed during the etching step.

In the invention, the etching step is performed instead of using the conventional seeding step. In contrast with the conventional method, which requires a time-consuming cleaning process to clean the silicon hydrides formed on the wall of the chamber, the duration of the process is effectively reduced by the present invention. Thus, the throughput of the fabricating process according to the present invention is increased.

These and other and advantages of the present invention will no doubt become obvious to those of ordinary skill in the art after having read the following detailed description of the preferred embodiments that are illustrated in the various figures.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
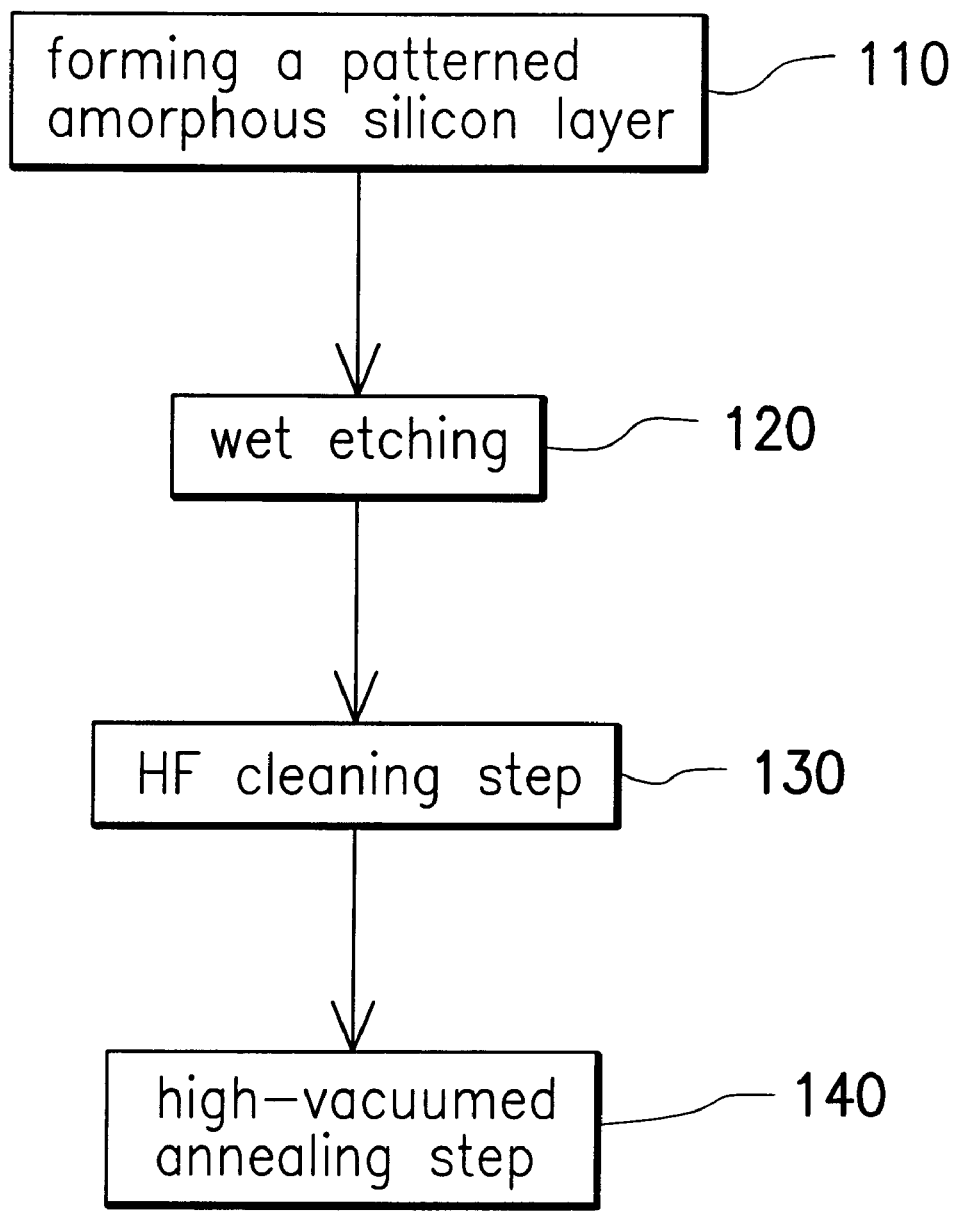
FIG. 1 is a flowchart of a fabricating method for a hemispherical grained silicon (HSG-Si) structure according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Reference is made to FIG. 1 and FIGS. 2A through 2C, which show a fabricating process and a fabricating flowchart for a HSG-Si structure according to one preferred embodiment of the invention.

Figure 2A:
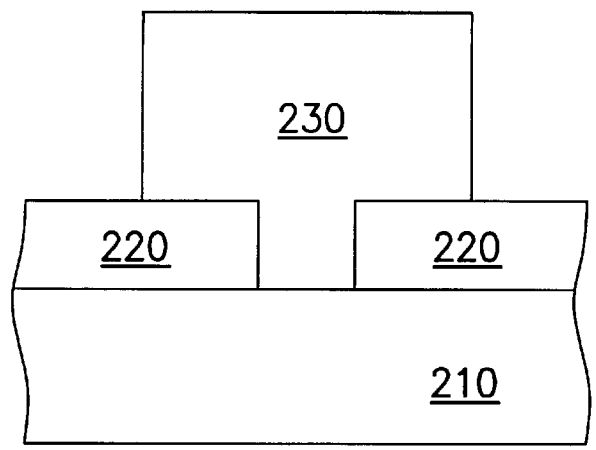
FIGS. 2A through 2C are schematic, cross-sectional views showing a method of fabricating a HSG-Si structure according to the preferred embodiment of the invention.

A step of forming a patterned amorphous silicon layer 110 is performed. In the preferred embodiment, a process for forming a bottom electrode is taken as an example. Referring to FIG. 2A, a patterned isolation layer 220 is formed on a substrate 210. The material of the isolation layer comprises silicon oxide. A patterned amorphous silicon layer 230 is formed on the isolation structure 220. The amorphous silicon layer 230 can be formed by, for example, low-pressure chemical vapor deposition (LPCVD), or plasma-enhanced chemical vapor deposition (PECVD).

A wet etching step 120 (shown in FIG. 1) is performed with an etching, solution. The etching solution is a mixed solution including hydrofluoric acid (HF), an oxidizing agent, and $H_2O$. The oxidizing agent of the etching solution is nitric acid ($HNO_3$), phosphoric acid ($H_3PO_4$), hydrogen peroxide ($H_2O_2$), or other suitable acids. The etching solution is made by mixing a volumetric ratio of the oxidizing agent: the 48% HF:$H_2O$ of about 25:5:16 to 25:10:50 together. The $H_3PO_4$ solution sold on the market visually has a concentration of about 85% and the $HNO_3$ solution commonly sold on the market usually has a concentration of about 65%.

Figure 2B:
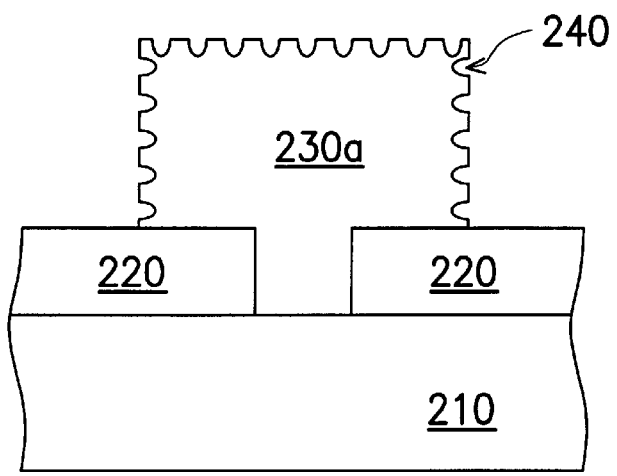
Figure 2C:
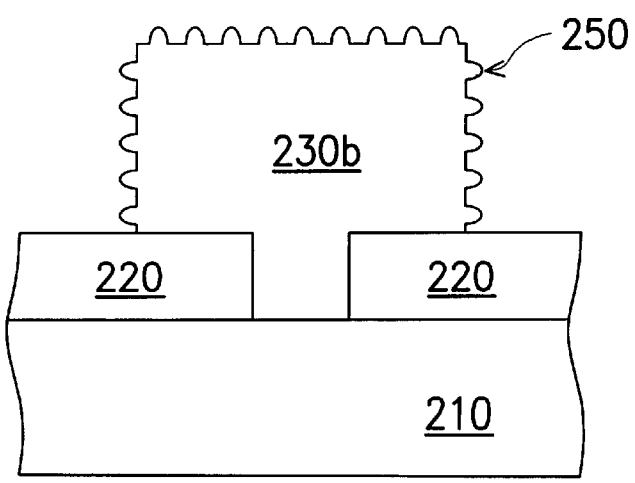

Referring to FIG. 2B, in the wet etching step 120, the oxidizing agent of the etching solution is used to oxide the surface of the amorphous silicon layer 230 to form silicon oxide (not shown). The hydrofluoric acid of the etching solution is used to dissolve the formation of silicon oxide. In this manner, the amorphous silicon layer 230 is etched to form cavities 240 in the surface of the amorphous silicon layer 230. Because different oxidizing agents have different oxidizing abilities and different oxidizing mechanisms, different etching parameters for etching are required. The preferable etching parameters, such as an etching time and an etching temperature, can be decided by those skilled in the art. For example, $HNO_3$ is a strong oxidizing agent, so, at room temperature, the etching step 120 (shown in FIG. 1) is performed for a time period of about 1 to 20 minutes with consideration for component proportions of the etching solution. The $H_3PO_4$ is a weak oxidizing agent, so the preferable etching temperature is the boiling temperature of the $H_3PO_4$ and the etching step is performed for a time period of about 5 to 60 minutes. It is appreciated that the those skilled in the art can determine a preferable etching parameters of the etching step 120, so other parameters with preferable ranges are not here described in detail.

The silicon oxide on the amorphous silicon layer 230a is removed with HF solution by a cleaning step 130. Because of the cleaning step 130, the cavities 240, which are not contaminated with the silicon oxide, are formed in the surface of an amorphous silicon layer 230a (shown in FIG. 2B). The HF solution used in this preferred embodiment has a volumetric ratio of 48% HF:$H_2O$ of about 1:10 to 1:100.

A high-vacuumed annealing step 140 (shown in FIG. 1) is performed at about 550° C. to 590° C. with a pressure of about $10^{-7}$ to $10^{-8}$ Torr. The annealing step is performed for a time period of about 1 minutes to 5 hours. The grain structures in the cavities 240 on the surface of amorphous silicon layer 230a are converted into the HSG-silicon structure 250 formed on an amorphous silicon layer 230b.

In summary, the invention includes at least the following advantages:

1. The surface of the amorphous silicon layer is etched with the HF solution and the oxidizing agent to form the grain structures among the cavities, which is advantageous for forming HSG-Si. The contaminates, such as silicon oxide, formed on the amorphous silicon layer are simultaneously removed during the etching step. Hence, the etching step of the present invention is effectively performed.

2. The etching step of the present invention is performed with a mixed solution of hydrofluoric acid (HF) and an oxidizing agent instead of using the conventional seeding step. In contrast with the conventional method, which requires a time-consuming cleaning process to clean out the silicon hydrides formed in the chamber by the seeding step, the time of the present invention is effectively reduced. The throughput of the fabricating process according to the present invention thus is further increased.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method for forming a hemispherical grained silicon (HSG-Si) structure, comprising the steps of:

forming an amorphous silicon layer over a substrate;

performing an etching step with an etching solution to form cavities in a surface of the amorphous silicon layer, wherein the etching solution comprises hydrofluoric acid, an oxidizing agent, and $H_2O$;

performing a cleaning step with a hydrofluoric solution; and performing an annealing step to form the HSG-Si structure.

2. The method of claim 1, wherein the step of forming the amorphous silicon layer comprises low-pressure chemical vapor deposition.

3. The method of claim 1, wherein the step of forming the amorphous silicon layer comprises plasma-enhanced chemical vapor deposition.

4. The method of claim 1, wherein the etching solution of the etching step has a volumeric ratio of the oxidizing agent: the hydrofluoric acid:$H_2O$ of about 25:6:16 to 25:10:50.

5. The method of claim 4, wherein the oxidizing agent comprises nitric acid having a concentration of 65%.

6. The method of claim 5, wherein the etching step is performed at a room temperature.

7. The method of claim 6, wherein the etching step is performed for a time period of about 1 to 20 minutes.

8. The method of claim 4, wherein the oxidizing agent comprises phosphoric acid having a concentration of 85%.

9. The method of claim 8, wherein the etching step is performed at a boiling temperature of the etching solution.

10. The method of the claim 9, wherein the etching step is performed for a time period of about 5 minutes to 60 minutes.

11. The method of claim 1, wherein the oxidizing agent comprises hydrogen peroxide.

12. The method of claim 1, wherein the hydrofluoric solution is mixed by a volumetric ratio of 48% hydrofluoric acid and $H_2O$ of about 1:10 to 1:100.

13. The method of claim 1, wherein the annealing step is performed at about 550° C. to 590° C.

14. The method of claim 1, wherein the annealing step is performed with a pressure of about $10^{-7}$ Torr to $10^{-8}$ Torr.

15. The method of claim 1, wherein the annealing step is performed for a time period of about 1 minute to 5 hours.

* * * * *